US010749541B1

(12) United States Patent
Stein et al.

(10) Patent No.: US 10,749,541 B1
(45) Date of Patent: Aug. 18, 2020

(54) TIME INTERLEAVED ANALOG TO DIGITAL CONVERTER WITH DIGITAL EQUALIZATION AND A REDUCED NUMBER OF MULTIPLIERS

(71) Applicant: Guzik Technical Enterprises, Mountain View, CA (US)

(72) Inventors: Anatoli B. Stein, Atherton, CA (US); Semen P. Volfbeyn, Palo Alto, CA (US); Valeriy Serebryanskiy, Santa Clara, CA (US)

(73) Assignee: Guzik Technical Enterprises, Mountain View, CA (US)

( * ) Notice: Subject to any disclaimer, the term of this patent is extended or adjusted under 35 U.S.C. 154(b) by 0 days.

(21) Appl. No.: 16/736,352

(22) Filed: Jan. 7, 2020

(51) Int. Cl.
*H03M 1/12* (2006.01)
*H03M 1/06* (2006.01)

(52) U.S. Cl.
CPC ......... *H03M 1/121* (2013.01); *H03M 1/0626* (2013.01); *H03M 1/128* (2013.01)

(58) Field of Classification Search
None
See application file for complete search history.

(56) References Cited

U.S. PATENT DOCUMENTS 5,239,299 A 8/1993 Apple et al.
6,035,320 A * 3/2000 Kiriaki .................. H03H 17/06 708/316
7,049,992 B1 5/2006 Hilton
7,079,992 B2 7/2006 Greiffenhagen et al.
7,408,495 B2 8/2008 Stein et al.
7,541,958 B2 6/2009 Xu
7,978,104 B2 7/2011 Johansson
8,542,142 B2 9/2013 Stein et al.
8,698,659 B2 4/2014 Hovakimyan et al.
2009/0033529 A1* 2/2009 Raz .................... H03M 1/1033 341/120
2013/0214958 A1* 8/2013 Stein .................. H03M 1/0626 341/155

(Continued)

OTHER PUBLICATIONS

Vetterli, Running FIR and IIR Filtering Using Multirate Filter Banks, IEEE Transactions on Acoustics, Speech, and Signal Processing, vol. 36. No. 5, May 1988.*

(Continued)

*Primary Examiner* — Howard Williams
(74) *Attorney, Agent, or Firm* — Burns & Levinson, LLP; Joseph M. Maraia

(57) ABSTRACT

A digital equalizer with reduced number of multipliers for correction of the frequency responses of an interleaved analog-to-digital-converter (ADC) is disclosed. An exemplary interleaved analog to digital converter with digital equalization includes at least one composite ADC including M time-interleaved sub-ADCs, and an equalization configuration deploying a Pre-FIR transformers unit, a FIRs assembly unit, and a Post-FIR transformers unit. The FIRs assembly unit includes a finite impulse response (FIR) filter network which is operative pursuant to a Fast Filtering Algorithm as an alternative to a conventional finite impulse response network, enabling a reduction of the number of multipliers compared to conventional FIR filter-based equalization networks for ADCs.

7 Claims, 9 Drawing Sheets

(56) References Cited

U.S. PATENT DOCUMENTS

2017/0117914 A1* 4/2017 Choi .................. H03M 1/1004

OTHER PUBLICATIONS

Rao et al., Correcting the Effects of Mismatches in Time-Interleaved Analog Adaptive FIR Equalizers, IEEE Transactions on Circuits and Systems—I: Regular Papers, vol. 59, No. 11, Nov. 2012.*
Lim et al., Time-Interleaved Analog-to-Digital-Converter Compensation Using Multichannel Filters, IEEE Transactions on Circuits and Systems—I: Regular Papers, vol. 56, No. 10, Oct. 2009.*
Mou et al., Short-Length FIR Filters and Their Use in Fast Nonrecursive Filtering, IEEE Transactions on Signal Processing, vol. 39 No. 6, Jun. 1991.*
Mou, Zhi-Jia, et al. Short-Length FIR Filters and Their Use in Fast Nonrecursive Filtering. IEEE Transactions on Signal Processing , vol. 39, No. 6. Jun. 1991.
Winograd, S. Signal Processing and Complexity of Computation. 1980.

* cited by examiner

Composite ADC with equalizer having switched FIR filters with constant coefficients Fast Filtering Unit equivalent to an FIR filter Adders Unit of Section #m

TIME INTERLEAVED ANALOG TO DIGITAL CONVERTER WITH DIGITAL EQUALIZATION AND A REDUCED NUMBER OF MULTIPLIERS

FIELD

This invention relates to high speed analog to digital converters (ADCs) and, more particularly, to digital equalization of composite ADCs, containing a plurality of time interleaved sub-ADCs.

BACKGROUND

To provide relatively high sampling rate analog to digital conversion, composite ADCs are typically used. A composite ADC contains a number of time interleaved sub-ADCs having a common input for receiving at the respective sub-ADCs, an applied to-be-converted analog signal. Same sampling rate sequential sampling timing signals are used to sample the analog signals applied to the inputs of the respective sub-ADCs. If the number of sub-ADCs equals M, then the resulting conversion rate is M times larger than the sampling rates of the individual sub-ADCs.

Each sub-ADC incorporated in a composite ADC, has its own distinct amplitude frequency response and phase frequency response, so that the amplitude frequency responses and phase frequency responses of the respective sub-ADCs are mutually misaligned. The misalignment of the frequency responses of the different sub-ADCs causes specific signal distortions at the digital signal output of the composite ADC, with the appearance of spurious frequency components being of prime importance. In order to reduce, or preferably, eliminate, the appearance of such spurious frequency components, outputs of the individual sub-ADCs are generally "equalized" and then combined, to provide an output for the ADC.

There are a number of ways in the prior art to prevent the appearance of distortions in a composite ADC, utilizing such equalization of the output digital signals of the sub-ADCs, as disclosed in several patents. For example, U.S. Pat. Nos. 7,079,992, 7,408,495 and 7,978,104, each propose an equalizer which is built as a time varying finite impulse response (FIR) filter. U.S. Pat. Nos. 5,239,299, 7,049,992, 7,541,958, 8,698,659 and others, describe an equalizer which is built as a set of switched FIR filters with constant coefficients. Both approaches (equalizers built as FIR filters with time varying coefficients, and equalizers built as a set of switched FIR filters with constant coefficients) are widely used in practice for equalization/correction of frequency responses of prior art composite ADCs.

FIG. 1 shows, in block diagram form, an example of a prior art ADC with equalization. The illustrated block diagram comprises a composite ADC 4, including a set of sub-ADCs, and a digital equalizer 5, which is built as a set of switched FIR filters with constant coefficients.

As shown, the Prior Art composite ADC 4 comprises M sub-ADCs, having a common input for receiving an analog signal-to-be-processed. The composite ADC 4 is characterized by a system clock signal at an overall sampling frequency $F_s$. Only three of the M sub-ADCs (denoted by reference designations sub-ADC #1, . . . , sub-ADC # m, . . . sub-ADC # M) are shown in FIG. 1, with the remaining sub-ADCs denoted by ellipses.

At each of the M sub-ADCs, the analog signal-to-be-processed is sampled at a sub-ADC sampling frequency $F_s/M$ by an associated one of M mutually time-offset forms of the system clock signal. Each of the M sub-ADCs is characterized by an associated, but distinct, complex frequency response $G_m(f)$, with m being the number of the sub-ADC, leading to the above-described misalignment-caused signal distortions at the output of the equalized Prior Art ADC.

The digital equalizer 5 of the Prior Art ADC attempts to effect equalization in order to offset the frequency response misalignment-caused distortions. As shown in FIG. 1, digital equalizer 5 consists of M sections, where each section includes M FIR filters. For example, section #1 comprises M FIR filters with reference designations $FIR_{11}$, . . . , $FIR_{1M}$. Outputs of those FIR filters are combined by an associated Adder, denoted Adder #1. The output of Adder #1 is connected to the output of the equalized ADC through a multiplexer switch $MX_1$, which operates synchronously with sub-ADC #1. In the same manner, M-1 sections similar to section #1, are coupled between the other M-1 sub-ADCs and an associated one of the M-1 Adders, all of whose outputs are connected to the output of the equalized ADC.

By way of further clarification, the section with reference designation m also comprises M FIR filters, with reference numbers $FIR_{m1}$, . . . , $FIR_{mM}$. The outputs of those FIR filters are combined by Adder # m and the output of that adder is connected to the output of the equalized ADC through an associated multiplexer switch $MX_m$. In general, the outputs of the composite ADC 4 are connected to the inputs of corresponding ones of the FIR filters of each section. The output of sub-ADC #1 is connected to the inputs of the $FIR_{11}$, $FIR_{21}$, . . . , $FIR_{M1}$. The output of any sub-ADC # m ($1 \le m \le M$) is connected to the inputs of the $FIR_{1m}$, $FIR_{2m}$, . . . , $FIR_{Mm}$.

The design of a prior art equalizer of a type such as that shown in FIG. 1, generally begins by a measurement of the frequency responses $G_m(f)$ of the sub-ADCs for $1 \le m \le M$. The measured frequency responses $G_m(f)$ then are used as initial data for calculation of the required frequency responses $H_{p,q}(f)$ of the $FIR_{p,q}$ ($1 \le p \le M$, $1 \le q \le M$). After that, the sets of coefficients of the different FIRs are calculated from the previously determined frequency responses $H_{p,q}(f)$ by one of known methods (for example, known as the "windows" method, the "frequency-sampling" method, the "optimum equi-ripple" method and the "method based on least-squares" approach). The purpose of the design in the prior art, is to compensate the deviations of frequency responses $G_m(f)$ from a chosen target frequency response. As a result, the misalignment between sub-ADCs frequency responses is eliminated or at least reduced, and the spurious frequency components are suppressed.

The principal components of FIR filters are multipliers. These multipliers have to operate with a frequency equal to the sampling rate $F_s$ of the ADC, which at present time achieves tens of giga-samples per second (GS/s). At the same time, contemporary FPGAs, at best, operate at the frequencies in the range 200-250 MHz. As a result, each multiplication in an FIR filter in high-speed ADCs, requires tens or hundreds multipliers, connected in parallel. The required number of multipliers becomes the main reason, which makes it necessary to use in the design of equalizers, more FPGAs or FPGAs of larger size, and often makes it impossible to develop equalizers which can operate in the real time mode.

There is known in the art, a set of effective algorithms adapted for "fast filtering," The application of such algorithms to an FIR filter allows a reduction in the number of multipliers in the FIR filter. These fast filtering algorithms (referred to hereinbelow as "Fast Filtering Algorithms")

originated in the basic work of S. Winograd "Arithmetic Complexity of Computations" (CBMS_NSF Regional Conf. Series in Applied Mathematics, SIAM Pub. 33, 1980) and have been developed farther in the articles of Z. Mou and P. Duhamel "Short-length FIR filters and Their Use in Fast Non-recursive Filtering" (IEEE Trans. on Signal Processing, vol. 19, No. 6, 1991), M. Vetterli "Running FIR and IIR Filtering Using Multirate Filter Banks" (IEEE Trans. Acoust., Speech, Signal Processing, vol. 36, No. 5, 1988) and others. According to the Fast Filtering Algorithms, any FIR filter with a length of L taps, may be replaced by an electrically equivalent compound unit, for example, of the type shown in FIG. 2, which is characterized by parameters K, $K_1$ and $K_2$.

An exemplary Fast Filtering Unit ("FFU"), shown in FIG. 2, includes a Pre-FIR transformer, a set of K sub-FIR filters $FIR_1$, $FIR_2$, . . . $FIR_K$, and a Post-FIR Transformer. In particular, in the block diagram of FIG. 2, an input digital signal with a sampling rate $F_s$ is initially processed in a Pre-FIR transformer. The Pre-FIR transformer produces K output signals, where each output signal has a reduced sampling rate $F_s/K_1$. The outputs of the Pre-FIR transformer are connected to respective inputs of K sub-FIR filters $FIR_1$, $FIR_2$, . . . $FIR_K$, where each FIR filter has a length $L/K_2$ taps. The outputs of the respective K sub-FIR filters are connected to respective inputs of a Post-FIR transformer. The Post-FIR transformer processes its set of K input signals and forms an output signal of the Fast Filtering Unit. In general, an FIR filter with a length of L taps, performs L multiplications with the frequency $F_s$ each. The K sub-FIR filters, $FIR_1$, $FIR_2$, . . . $FIR_K$, in FIG. 2 perform $K \cdot L/K_2$ multiplications, each with frequency $F_s/K_1$. With this structure and format, the equivalent compound unit of FIG. 2 which implements a Fast Filtering Algorithm, requires a number of multipliers, which is $K_1 \cdot K_2/K$ times fewer than the number of multipliers required in a conventional FIR filter.

The parameters K, $K_1$ and $K_2$ depend on a specific Fast Filtering Algorithm, while the complex frequency response of the equivalent compound unit which replaces the inefficient original FIR filter, is determined by the coefficients of the sub-FIRs $FIR_1$, $FIR_2$, . . . $FIR_K$ of FIG. 2 that are used.

A digital equalizer for a composite ADC, built with the use of such a Fast Filtering Algorithm, was disclosed in U.S. Pat. No. 8,542,142 (the "'142 patent") of the same inventors as in the subject invention. The equalized ADC of the '142 patent permits a reduction in the required number of multipliers in the equalizer compared to ADCs of the then-prior art. However, the equalizer disclosed in the '142 patent is constructed in the form of a filter with time varying coefficients. For that reason, it is necessary to use parallel processing of an input signal, splitting the input signal into leading N-groups and lagging N-groups, and adding to the design a repositioning unit and double buffer FIR filters with a consequent complication of the device.

The purpose of the present disclosure is to disclose a digital equalizer for a composite ADC which is obtained by applying a Fast Filtering Algorithm to an initial equalizer built as a set of switched FIR filters with constant coefficients. Such an approach makes it possible to reduce the number of multipliers in the equalizer as compared to the number off multipliers required in ADCs of the prior art, including the ADCs of the '142 patent. In that way the greatest possible reduction of the required resources is achieved.

DETAILED DESCRIPTION

According to the present disclosure, a time interleaved analog to digital conversion system with digital equalization and reduced number of multipliers, is produced by applying the theory of Fast Filtering Algorithms to an equalizer which is built as a set of switched FIR filters with constant coefficients. In this way, the greatest possible reduction of the required number of multipliers is achieved.

Figure 3:
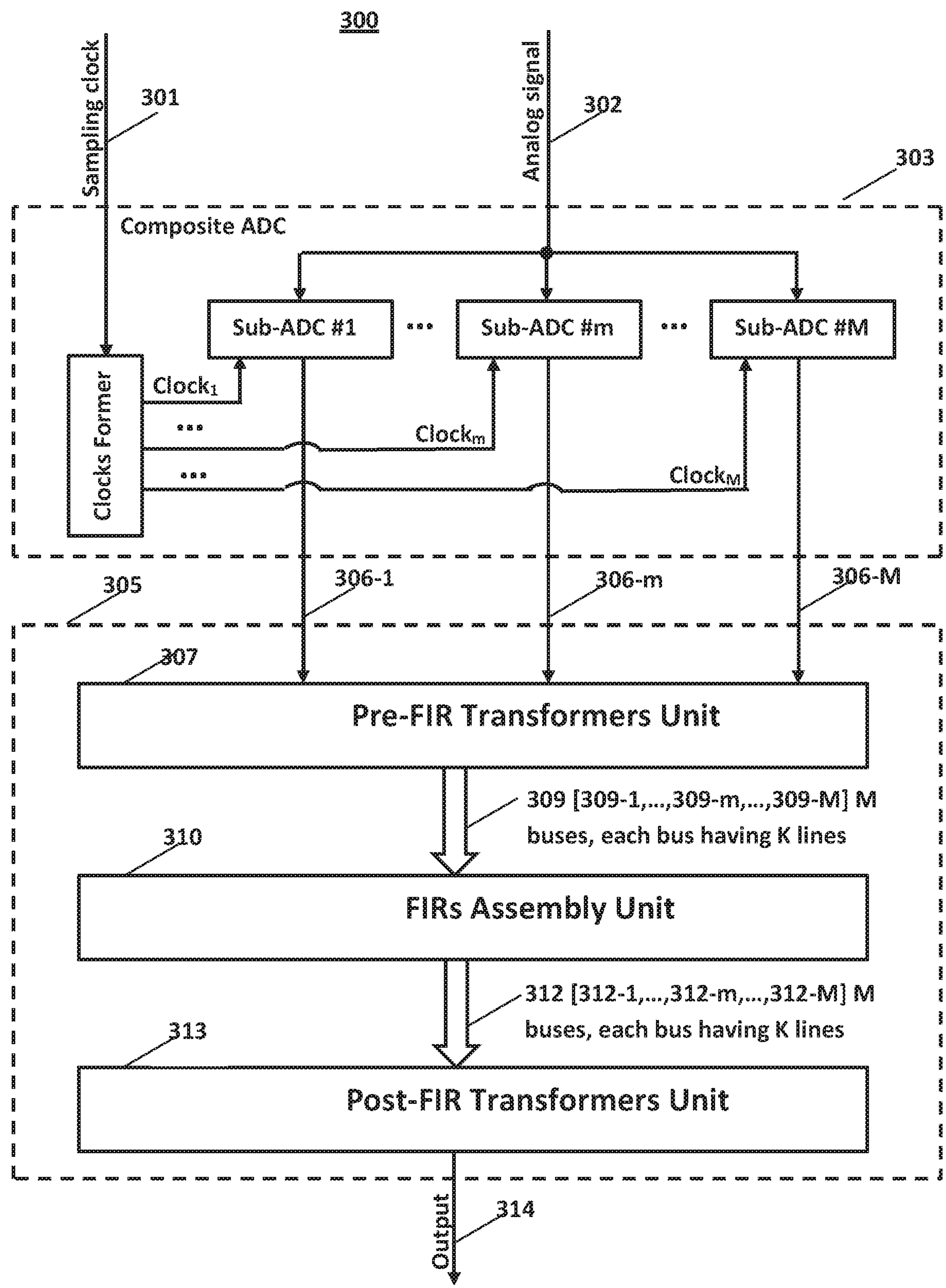
FIG. 3 is a block diagram of a composite analog to digital converter system with digital equalization and a reduced number of multipliers according to the present disclosure.

A block diagram of an exemplary time interleaved analog to digital conversion system 300 with digital equalization and reduced number of multipliers, according to the present disclosure, is shown in FIG. 3. The time interleaved analog to digital converter system 300 has a signal input 302 at which it receives an analog signal to-be-processed, a sampling clock input 301 and an output 314, where the produced digital signal islaced. The system 300 includes a composite ADC 303 and an associated digital equalizer 305.

The composite ADC 303 has an overall effective sampling frequency $F_s$ and comprises a clock former together with M sub-ADCs: sub-ADC #1, . . . , sub-ADC # m, . . . , sub-ADC # M. Only three of the M sub-ADCs (denoted by reference designations 1, m, and M) are shown in FIG. 3, with the remaining sub-ADCs denoted by ellipses. Each of the M sub-ADCs includes an input, coupled to a common input 302, for receiving an analog signal-to-be-processed. The clock former splits the sampling clock into M mutually time-offset partial clocks ($Clock_1$, . . . , $Clock_m$, . . . , $Clock_M$). Each partial clock has a frequency $F_s/M$ and feeds an associated sub-ADC. In operation, at each of the M sub-ADCs, the analog signal-to-be-processed from input 302 is sampled at a sub-ADC sampling frequency $F_s/M$ by an associated one of the mutually time-offset forms of the applied system clock signals $Clock_1$, . . . , $Clock_m$, . . . , $Clock_M$. Each sub-ADC is characterized by a complex frequency response $G_m(f)$, where m is an identifying number of the $m^{th}$ sub-ADC. Each sub-ADC converts its applied input signal into an under-sampled digital signal and places that signal on an associated one of M output lines 306-1, . . . , 306-*m*, . . . , 306-M.

The M sets of output lines 306-1, . . . , 306-*m*, . . . , 306-M of composite ADC 303 are respectively connected to associated inputs of the digital equalizer 305. The digital equalizer 305 consists of a Pre-FIR Transformers Unit 307, a FIRs Assembly Unit 310 and a Post-FIR Transformers Unit 313, coupled in series. The output of the equalizer 314 is used as the output of the analog to digital converter system 300. The Pre-FIR Transformers Unit 307, FIRs Assembly Unit 310 and Post-FIR Transformers Unit 313 comprise the associated components of Fast Filtering Units FFUs which replace the FIRs of the system of the block diagram of FIG. 1.

Figure 1:
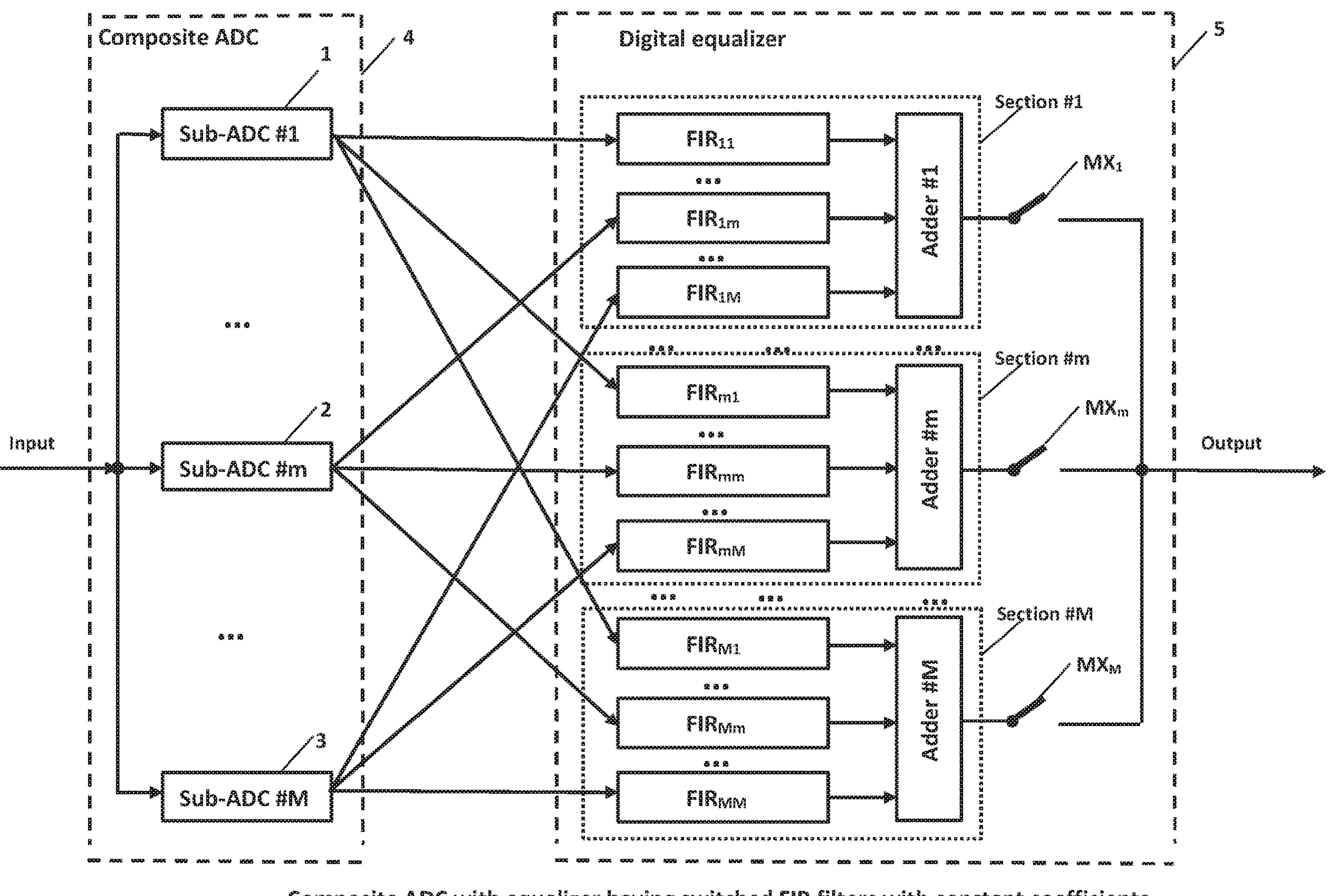
FIG. 1 is a block diagram of a prior art composite ADC with an equalizer which is built as a set of switched FIR filters with constant coefficients.
Figure 2:
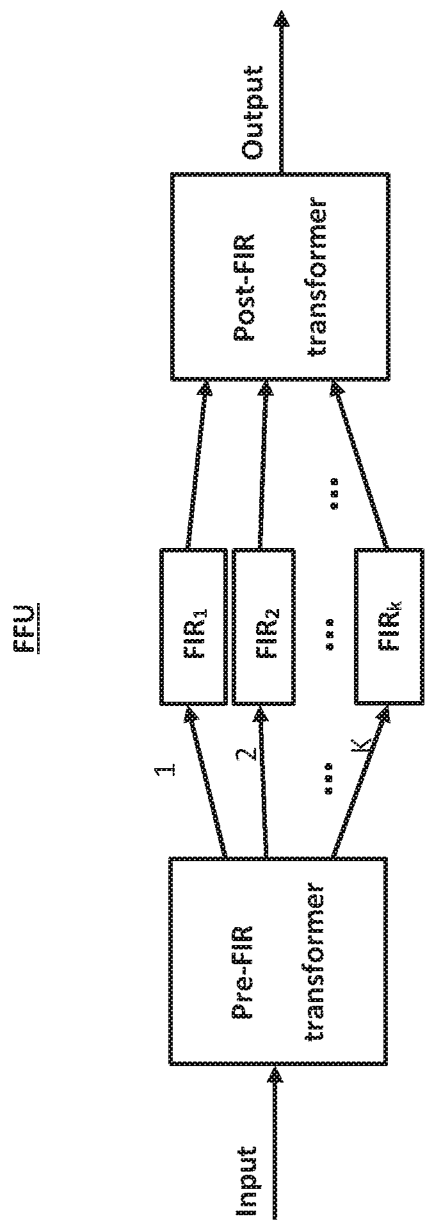
FIG. 2 is a block diagram of an exemplary prior art Fast Filtering Unit, equivalent to an FIR filter.

The Pre-FIR Transformers Unit 307 combines the Pre-FIR Transformers of all Fast Filtering Units, replacing the FIRs of the prior art system of FIG. 1. As mentioned above, the lengths of all FIRs in the prior art system of FIG. 1 usually is chosen to be the same. The sampling frequency for all these FIRs is the same ($F_s/M$) as well. Therefore, all the Pre-FIR transformers in the replacement units of the system of FIG. 3, which substitute the FIRs of the prior art system of FIG. 1, are identical.

Figure 4A:
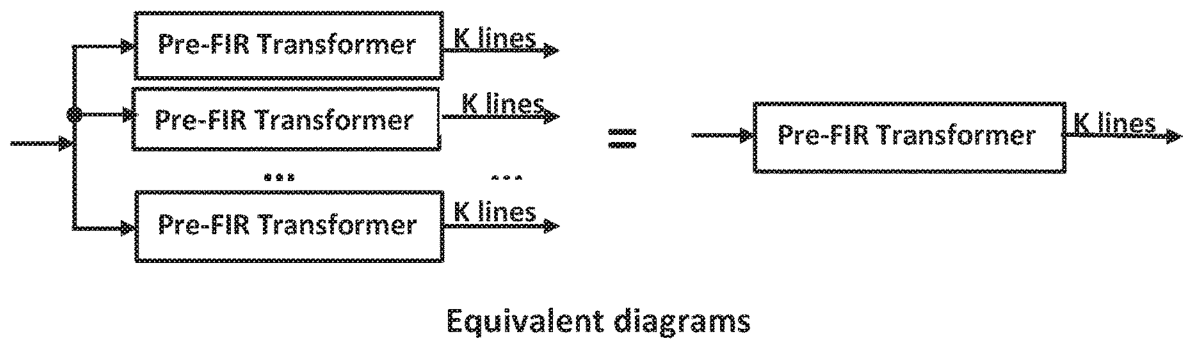
FIG. 4A is a block diagram of a Pre-FIR Transformers Unit of the composite analog to digital converter system of FIG. 3.

If identical Pre-FIR transformers receive the same input signal, they produce the same signals at the outputs. Therefore, the Pre-FIR transformers of the novel system of FIG. 3, which have common inputs connected to the outputs of their associated sub-ADC, may be replaced by one Pre-FIR transformer (for example, as shown in FIG. 4A). Based on this ground, the block diagram of the Pre-FIR transformers unit is simplified to a form, shown in FIG. 4B. This block diagram comprises M Pre-FIR transformers (instead of $M^2$, as it would be if the block diagram was not simplified). The inputs of transformers are used as inputs of the unit. K outputs of each transformer are collected in a bus, which leads to an associated unit output.

Figure 4B:
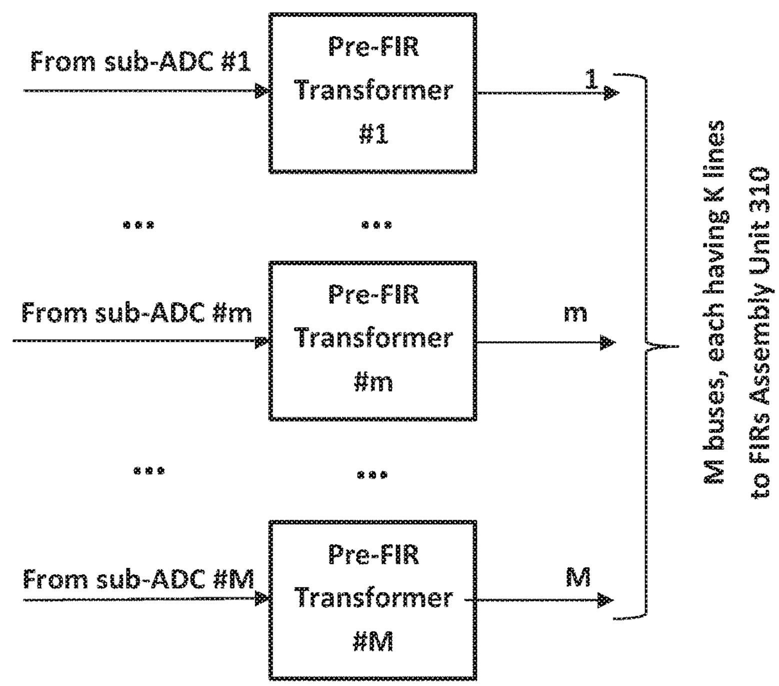
FIG. 4B is a detailed block diagram of a Pre-FIR Transformers Unit of the composite analog to digital converter system of FIG. 3.

As it is shown in FIG. 4B, the Pre-FIR Transformers Unit 307 includes M Pre-FIR Transformers: Pre-FIR Transformer #1, . . . , Pre-FIR Transformer # m, . . . , Pre-FIR Transformer # M, with each Pre-FIR Transformer having an input, coupled to an output of a respective sub-ADC of the unit 303, and an output, coupled to a respective one of the output buses 309 of M Pre-FIR Transformers Unit 307.

In operation, each of Pre-FIR Transformers #1, . . . , # m, . . . , # M, transforms its respective one of the M input streams of digital samples, received from the output lines 306 of the M sub-ADCs, into K output streams, prepares the produced K output streams for subsequent processing by FIRs Assembly Unit 307, and places so-prepared K output streams at a corresponding ones of the M K-line output buses 309-1, . . . , 309-*m*, . . . , 309-M of the Pre-FIR Transformers Unit 307 outputs.

The outputs on the M K-lines output buses 309 of the Pre-FIR Transformers Unit 307 are respectively connected to corresponding ones of M input buses of FIRs Assembly Unit 310. The buses 312-1, . . . , 312-*m*, . . . , 312-M connect the outputs of the FIRs assembly unit 310 with the respective inputs of Post-FIR Transformers Unit 313.

Figure 5:
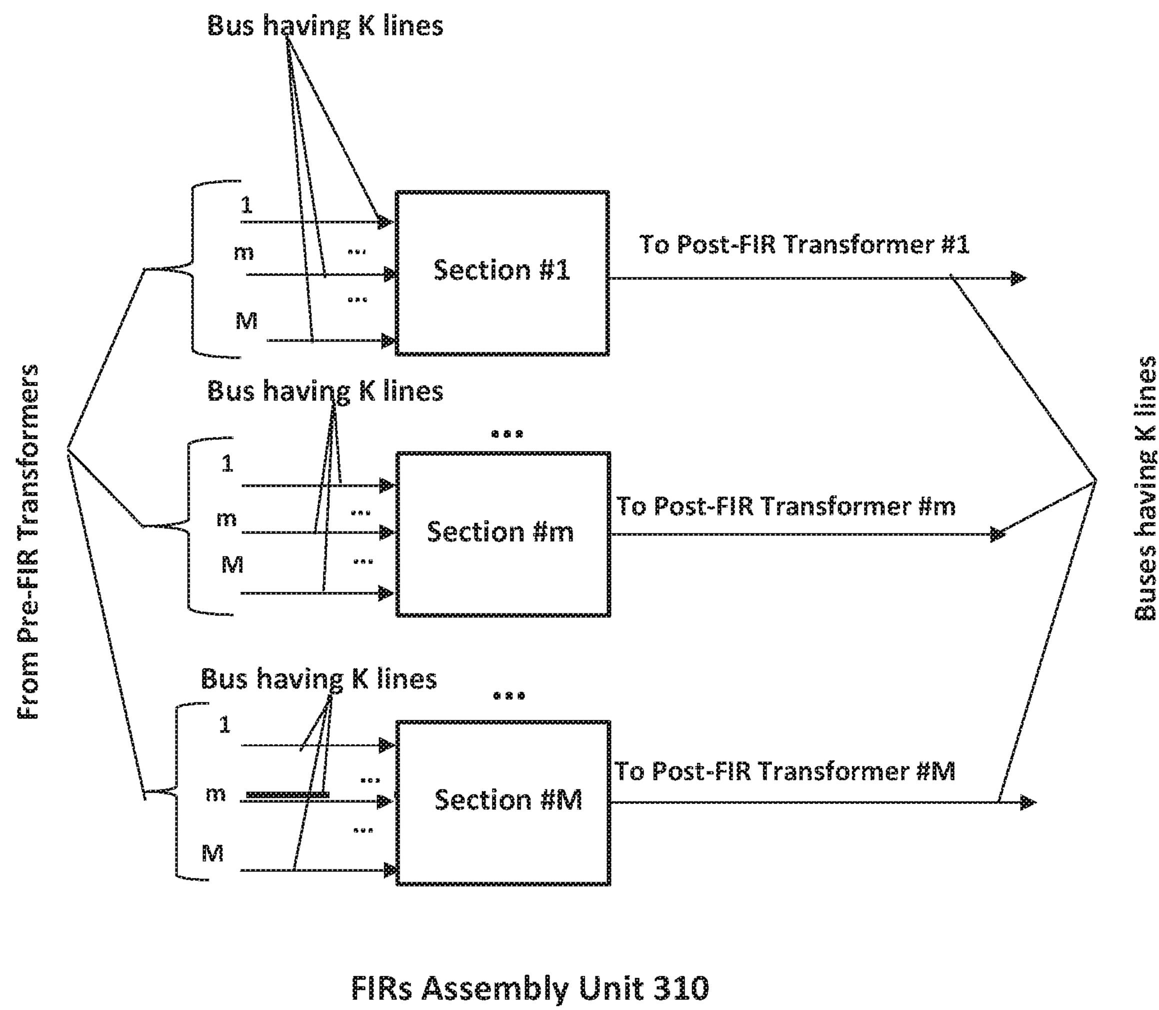
FIG. 5 is a block diagram of the FIRs Assembly Unit of the composite analog to digital converter system of FIG. 3.
Figure 6:
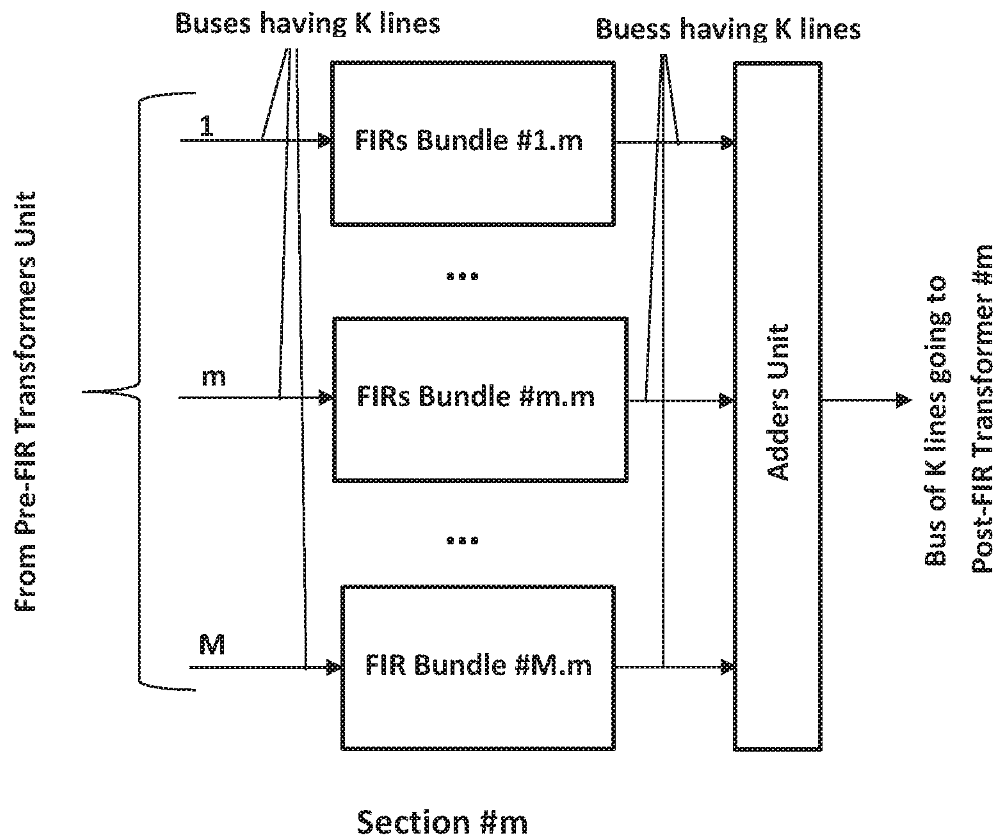
FIG. 6 is a block diagram of section # m of an exemplary FIR Assembly Unit of the composite analog to digital converter system of FIG. 3.
Figure 7:
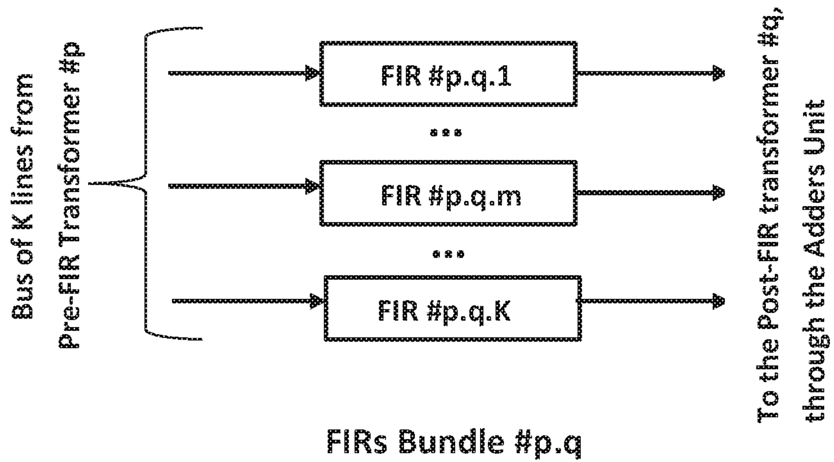
FIG. 7 is a block diagram of the FIRs bundle # p.q. of the FIR Assembly Unit of the composite analog to digital converter system of FIG. 3.
Figure 8:
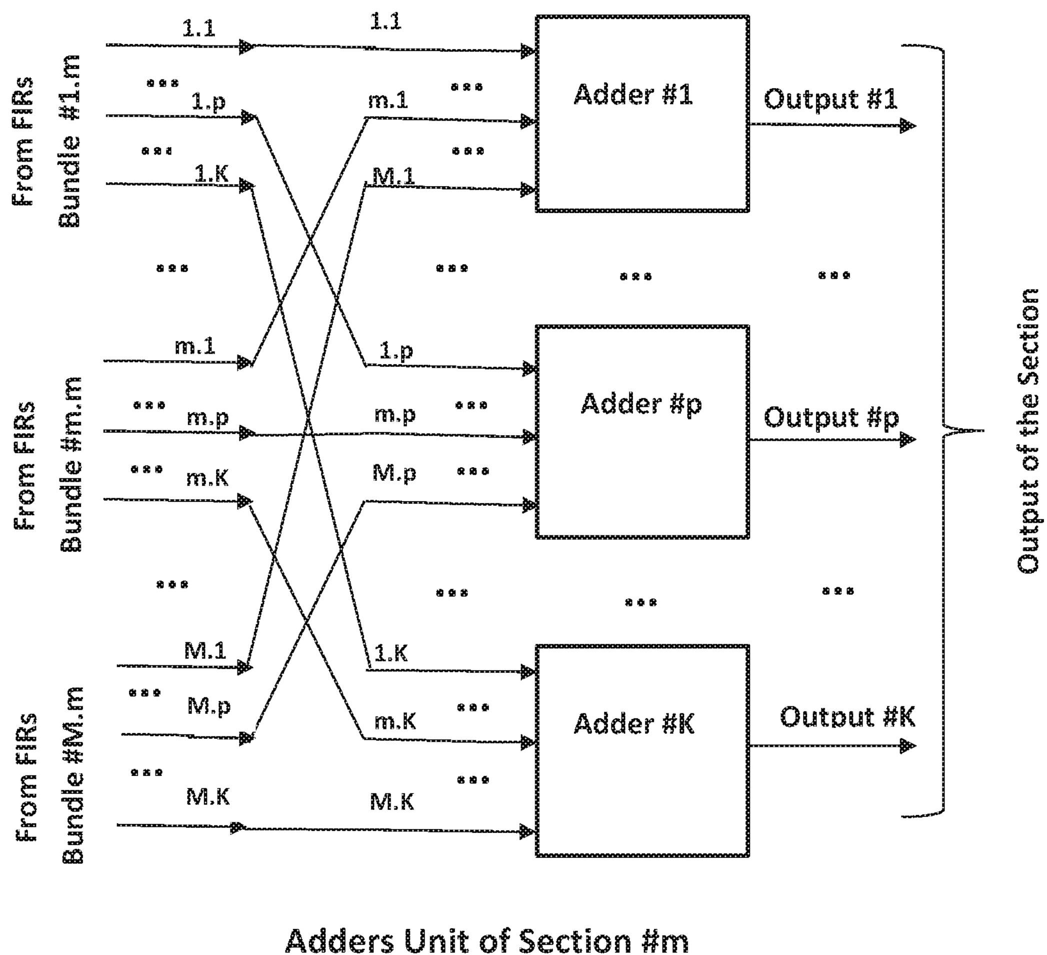
FIG. 8 is a block diagram of an exemplary Adders Unit of the section # m of the FIR Assembly Unit of the composite analog to digital converter system of FIG. 3.

An exemplary FIRs Assembly Unit 310 is shown in FIG. 5 generally, and in detail in FIGS. 6-8. The FIRs Assembly Unit 310 includes M assembly sections: Assembly Section #1, . . . , Assembly Section # m, . . . , Assembly Section # M. Each Assembly Section has an input, coupled to a respective one of the M K-lines output buses 309 of Pre-FIR Transformers Unit 307. The outputs of the assembly sections coupled to respective ones of the M K-lines output buses 312.

In operation, the FIRs Assembly Unit 310 produces K·M output signals. Each FIR filter in the FIRs Assembly Unit 310 calculates a convolution of its input signal with a preliminary prepared set of coefficients. The calculation results are summed for groups of the input signals of the FIRs Assembly Unit 310, which have been produced by its associated sub-ADC of Composite ADC 303. Each assembly section of the FIRs Assembly Unit 310 places its received summed calculation result at the FIRs Assembly Unit outputs 312 at a respective one of the M K-lines output buses.

A section of the FIRs Assembly Unit 310 consists of M FIR bundles (FIG. 6). As it is shown in FIG. 7, an FIR Bundle is a collection of K FIRs. All FIRs of an FIR Bundle receives input signals from the same Pre-FIR Transformer. The outputs of a FIR Bundle are connected by a bus of K lines to a group of inputs of the Adders Unit (FIG. 6). The K outputs of the Adders Unit are used as the associated outputs of the section.

The inner structure of an exemplary Adders Unit is shown in FIG. 8. In that figure, the Adders Unit has M groups of inputs, where each group comprises K individual inputs. Each individual input is denoted by a pair m.p. The first number in the pair indicates the number of the Pre-FIR Transformer which produced the corresponding incoming signals. The second number in the pair indicates the position of an input in the group of inputs. There are K adders in each Adders Unit, where each adder has M inputs and an output. The input number m of the adder with the number p is connected to the input of the Adders Unit denoted by the pair m.p. To put it differently, an adder gathers all the inputs which occupy the same position in the group inputs of the Adders Unit (the number of this position being identical to the number of the adder). The output of an adder with the number p is used as the individual output which holds the positions with the number p in the group output of the Adders Unit.

Figure 9A:
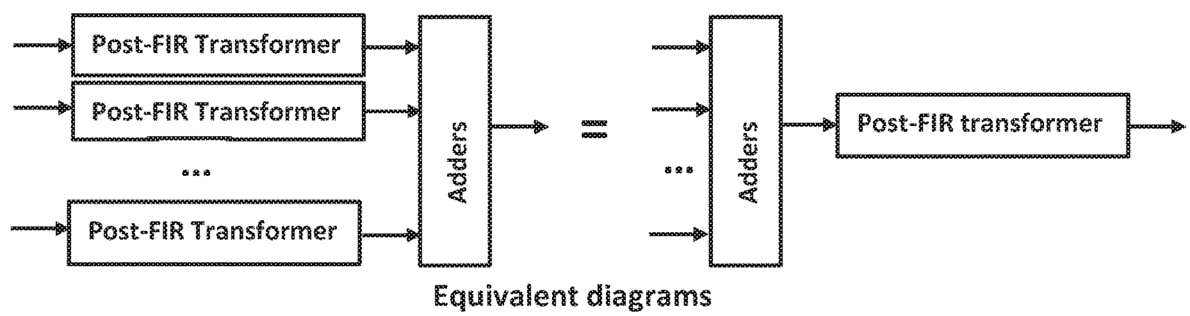
FIG. 9A is a block diagram of a Post-FIR Transformers Unit of the composite analog to digital converter system of FIG. 3.
Figure 9B:
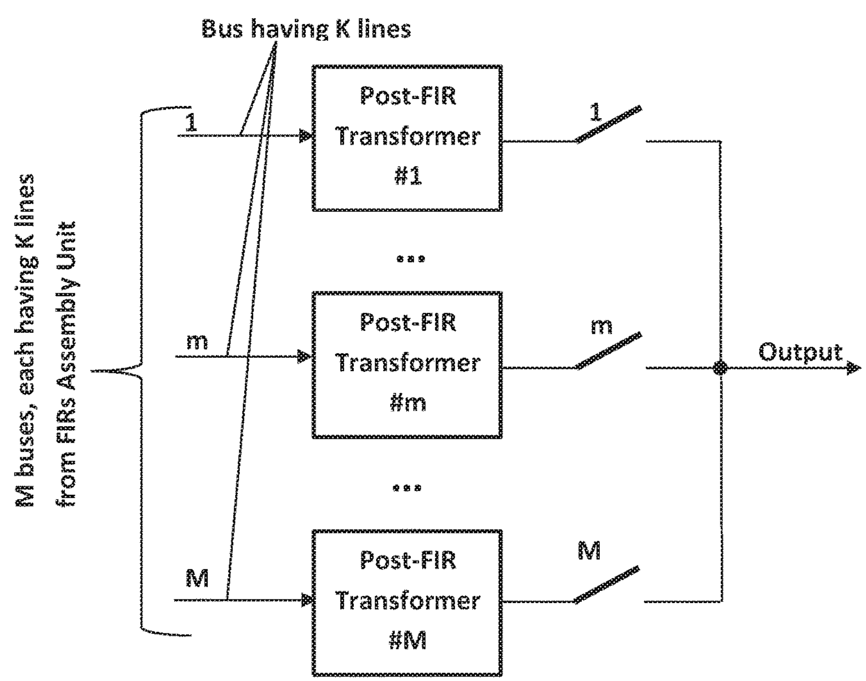
FIG. 9B is a detailed block diagram of a Post-FIR Transformers Unit of the composite analog to digital converter system of FIG. 3.

The outputs of the FIRs Assembly Unit 310 are connected to the respective inputs of Post-FIR Transformers Unit 313 by the buses 312. An exemplary Post-FIR Transformers Unit 313 is shown in FIG. 9B. The Post-FIR Transformers Unit 313 comprises M Post-FIR Transformers #1, . . . , # m, . . . , # M, and a multiplexer, formed by the switches 1, . . . , m, . . . , M. Each Post-FIR transformer, incorporated in the Post-FIR Transformers Unit 313, has K input lines (coupled to respective outputs of the FIRs Assembly Unit 310) and an output 314, serving as the system output.

Reasoning, similar to the one which has been conducted above for the Pre-FIR transformers, shows that the Post-FIR transformers in the Post-FIR Transformers Unit 313 are identical. Therefore, since the Post-FIR Transformers operate synchronously, a sum of Post-FIR Transformers output signals equals the sum of the input signals which has been passed through one Post-FIR Transformer (see FIG. 9A). This fact is used as a basis for simplification of the Post-FIR transformers unit in the equalizer of this disclosure.

In operation, the Post-FIR Transformers Unit 313 processes input signals, received from the M FIRs bundles of FIRs Assembly Unit 310. The processing is in accord with a Fast Filtering Algorithms, for example, with a Fast Filtering Algorithms of the type described in the above cited articles. The multiplexer, composed of the switches 1 . . . M of the FIG. 9B, combines the so-processed signals into a single stream of digital samples and places that steam at the output 314 of the Post-FIR Transformers Unit 313, which is, at the same time, the output of the analog to digital conversion system 300. The signal at output 190 presents a corrected version of the stream of digital samples produced by the composite ADC 303.

In practice, a composite ADC very often consists of two sub-ADCs. An exemplary form of such a composite ADC 200 consisting of two sub-ADCs, with equalization and having a reduced number of multipliers in keeping with the disclosure herein, is shown in FIG. 10.

Figure 10:
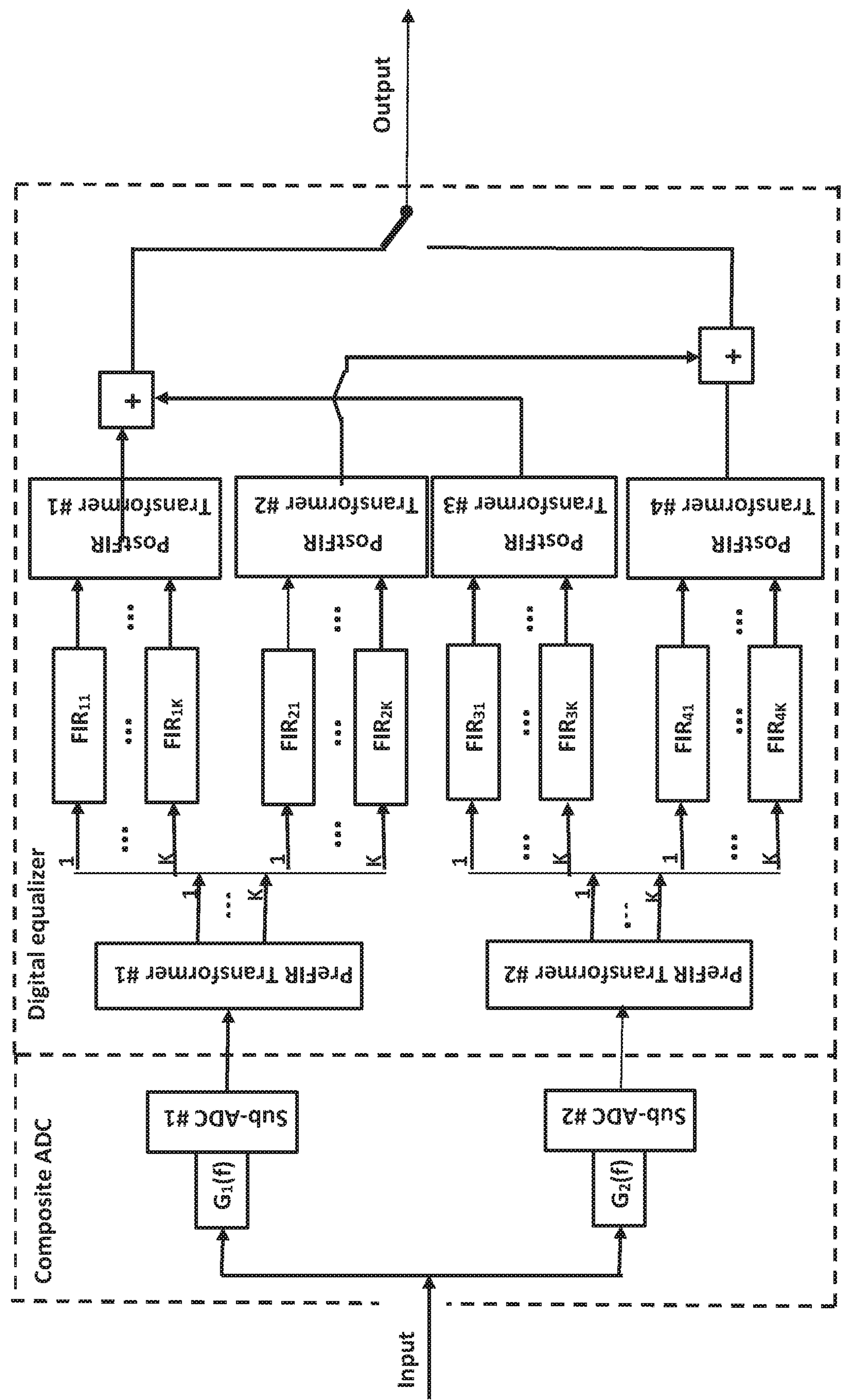
FIG. 10 is a block diagram of the analog to digital converter with digital equalization and reduced number of multipliers according to the present disclosure, for an exemplary case when the composite ADC consists of two sub-ADCs.

In the block diagram of FIG. 10, the exemplary equalized converter 200 has some distinctive component-saving features:

(i) the "1 adder-unit-per-sub-ADC" shown in the exemplary configuration of FIGS. 3-9, is changed to a "1 adder-unit-per-2-sub-ADCs" configuration of FIG. 10, saving the component count of one adder, and (ii) the "multiple switch output multiplexer" shown in the single sub-ADC exemplary configuration of FIGS. 3-9, is replaced by a simple switch.

In the block diagram of FIG. 10, the output of sub-ADC #1 is connected to the input of Pre-FIR Transformer #1, while the output of sub-ADC #2 is connected to the input of ($FIR_{21}$, . . . , $FIR_{2K}$). The K outputs of the Pre-FIR transformer #2 are connected to the K inputs of the third bundle of FIR filters ($FIR_{31}$ . . . , $FIR_{3K}$) and to the K inputs of the fourth bundle of FIR filters ($FIR_{41}$, . . . , $FIR_{4K}$).

The outputs of the FIR filters, incorporated in one bundle, are connected to the inputs of an associated Post-FIR transformer. Each Post-FIR transformer processes its input signals and combines them into an output signal. The output signals of the Post-FIR transformers #1 and #3 are summarized by the first adder. The output signals of the Post-FIR transformers #2 and #3 are summarized by the second adder. In that way, corrected versions of the sub-ADCs output signals are produced.

The corrected under-sampled signals are combined into a signal with the sampling rate $F_s$ by a switch, whose operation is synchronized with the operation of the sub-ADCs. The signal produced by the switch is placed at the output of the equalizer.

In summary, the time interleaved analog to digital converter with digital equalization and reduced number of multipliers according to the present disclosure, is much more simple than the analogous device which has been described in the U.S. Pat. No. 8,542,142, and, at the same time, provides a considerable decrease in the required resources as compared with other known equalizers for composite ADCs. This fact considerably extends the area of application of the herein disclosed converter, especially in the field where increased spurious-free dynamic range and real time mode of operation are required.

The foregoing description of the embodiment of the present technology contains some details for purposes of clarity of understanding, the technology is not limited to the detail provided. There are many alternative ways of implementing the technology. The disclosed embodiment is illustrative and not restrictive.

What is claimed is:

1. A time interleaved analog to digital converter with digital equalization and reduced number of multipliers, comprising:

A. a composite analog to digital converter (ADC) characterized by a system sampling frequency $F_s$, including M time interleaved sub-ADCs,
wherein
i. each sub-ADC has an input,
ii. each sub-ADC has an output,
iii. the inputs of the M sub-ADCs are adapted to receive a common analog signal-to-be-processed applied thereto, and
iv. each sub-ADC is responsive to an applied one of a set of M mutually time-offset sampling signals characterized by a sampling frequency $F_s/M$, to generate at its output, a stream of digital samples representative of a succession of samples of the applied signal-to-be-processed, B. a Pre-FIR transformers unit, with a coefficient of signal splitting equal K, having M inputs, connected to the respective outputs of the composite ADC, and M·K Pre-FIR outputs, wherein said Pre-FIR transformers unit:
i. transforms each of the input streams of digital samples into K streams,
ii. prepares the produced K streams for subsequent processing and
iii. applies the prepared K streams at an associated group of M·K Pre-FIR outputs;

C. a FIRs assembly unit, having M·K inputs, connected to the outputs of the Pre-FIR transformers unit, and M·K FIRs assembly outputs, wherein said FIRs assembly unit includes M·K finite impulse response filters (FIRs) characterized by constant coefficients adapted to:
i. pursuant to a Fast Filtering Algorithm, calculate a convolution of each input signal with a set of the constant coefficients,
ii. sum the calculation results for specific groups of inputs and
iii. apply the sums to respective ones of the M·K FIRs assembly outputs; and D. a post-FIR transformers unit, having M·K post-FIR inputs and a post-FIR output, wherein the M·K post-FIR inputs of the post FIRs transformers unit are coupled to the M·K FIRs assembly outputs, and wherein said post-FIRs transformers unit is adapted to:
i. transform each group of K input streams of digital samples which generated by the same sub-ADC, into an intermediate stream,
ii. integrate the produced M intermediate streams into a stream with sampling frequency $F_s$ and
iii. apply the stream to the post-FIR output.

2. A time interleaved analog to digital converter with digital equalization and reduced number of multipliers as in claim 1, wherein the Pre-FIRs transformers unit consists of M Pre-FIRs transformers, each Pre-FIRs transformer having one input and K outputs, the inputs of all Pre-FIRs transformers being connected to the corresponding inputs of the Pre-FIRs transformers unit and the outputs of the Pre-FIRs transformers being used as outputs of the Pre-FIRs transformers unit, wherein each Pre-FIRs transformer is adapted to split the input signal into K signals, prepare them for the following processing and put them at the unit outputs.

3. A time interleaved analog to digital converter with digital equalization and reduced number of multipliers as in claim 2, wherein the FIRs assembly unit consists of M sections, each section having M·K inputs and K outputs, wherein the analogous inputs of the sections are united and used as the inputs of the FIR assembly unit while the outputs of the sections are used as the outputs of the FIR assembly unit.

4. A time interleaved analog to digital converter with digital equalization and reduced number of multipliers as in claim 3, wherein a section of the FIR assembly unit consists of M FIRs bundles and an adders unit, each FIRs bundle having K inputs and K outputs, the adder unit having M·K inputs and K outputs, wherein the inputs of the bundles are used as inputs of the section, the outputs of the bundles are connected to the inputs of the adders unit, and the outputs of the adders unit are used as the outputs of the section.

5. A time interleaved analog to digital converter with digital equalization and reduced number of multipliers as in claim 4, wherein a FIRs bundle consists of K FIRs, each FIR having an input, which is used as a bundle input, and an output which is used as a bundle output, wherein each FIR is adapted to calculate the convolution of the input signal with preliminary prepared set of coefficients.

6. A time interleaved analog to digital converter with digital equalization and reduced number of multipliers as in claim 5, wherein the Post-FIR transformers unit consists of M Post-FIR transformers and a multiplexer, each Post-FIR transformer has K inputs being used as inputs of the Post-FIR transformers unit, and an output, the multiplexer has M inputs and an output, each input of the multiplexer being connected to the output of the corresponding Post-FIR transformer and the output of the multiplexer being used as an output of the Post-FIR transformers unit, wherein each Post-FIR transformer is adapted to produce a corrected version of the stream of digital samples produced by the corresponding sub-ADC.

7. A time interleaved analog to digital converter with digital equalization and reduced number of multipliers, comprising:

A. a composite ADC with sampling frequency $F_s$, consisting of two sub-ADCs, the inputs of the sub-ADCs being joined together to form an input of the composite ADC, while the outputs of sub-ADCs being used as the outputs of the composite ADC, wherein the composite ADC is adapted to generate at its outputs two streams of digital samples with sampling frequency $F_s/2$ each, said streams of digital samples corresponding to the analog signal, applied to the input of the composite ADC;

B. a Pre-FIRs transformer #1 and a Pre-FIRs transformer #2, each Pre-FIRs transformer having one input and K outputs, the input of each Pre-FIRs transformer being connected to the output of the corresponding sub-ADC, wherein each Pre-FIRs transformer is adapted to split the input signal into K signals, prepare them for the following processing and put them at the outputs;

C. the $FIR_{11}, \ldots, FIR_{1k}$ and the $FIR_{21}, \ldots, FIR_{2k}$, with inputs being connected to the corresponding outputs of the Pre-FIRs transformer #1, wherein each FIR is adapted to calculate the convolution of the input signal with preliminary prepared set of coefficients;

D. the $FIR_{31}, \ldots, FIR_{3k}$ and the $FIR_{41}, \ldots, FIR_{4k}$, with inputs being connected to the corresponding outputs of the Pre-FIRs transformer #2, wherein each FIR is adapted to calculate the convolution of the input signal with preliminary prepared set of coefficients;

E. a Post-FIRs transformer #1, a Post-FIRs transformer #2, a Post-FIRs transformer #3, and a Post-FIRs transformer #4, each Post-FIRs transformer having K inputs and an output, the inputs of the Post-FIRs transformer #1 being connected to the outputs of the $FIR_{11}, \ldots, FIR_{1k}$, the inputs of the Post-FIRs transformer #2 being connected to the outputs of the $FIR_{21}, \ldots, FIR_{2k}$, the inputs of the Post-FIRs transformer #3 being connected to the outputs of the $FIR_{31}, \ldots, FIR_{3k}$, and the inputs of the Post-FIRs transformer #4 being connected to the outputs of the $FIR_{41}, \ldots, FIR_{4k}$;

F. an adder #1 and an adder #2, each adder having two inputs and an output, the first input of the adder #1 being connected to the output of the Post-FIRs transformer #1, the second input of the adder #1 being connected to the output of the Post-FIRs transformer #3, the first input of the adder #2 being connected to the output of the Post-FIRs transformer #2, the second input of the adder #2 being connected to the output of the Post-FIRs transformer #4; and G. a switch with two inputs and an output, the first input of the switch being connected to the output of the adder #1, the second input of the switch being connected to the output of the adder #2, and the output of the switch being used as the output of the device.

* * * * *